United States Patent [19]

Mears

[11] Patent Number: 5,539,400
[45] Date of Patent: Jul. 23, 1996

[54] ULTRA-LOW POWER, SCAN ON DEMAND KEYPAD ENCODER

[75] Inventor: James A. Mears, Puyallup, Wash.

[73] Assignee: National Semiconductor Corporation, Santa Clara, Calif.

[21] Appl. No.: 527,974

[22] Filed: Sep. 14, 1995

Related U.S. Application Data

[63] Continuation of Ser. No. 293,818, Aug. 22, 1994, abandoned.

[51] Int. Cl.⁶ .................................................. H03M 1/22
[52] U.S. Cl. ............................... 341/22; 341/25; 341/26; 364/707
[58] Field of Search ........................ 364/709.12, 709.15, 364/709.16, 707; 341/22, 25, 26; 178/18, 19

[56] References Cited

U.S. PATENT DOCUMENTS

| | | | |
|---|---|---|---|
| 4,109,315 | 8/1978 | Pan | 364/707 |
| 4,266,278 | 5/1981 | Ebihara et al. | 341/26 |
| 4,305,065 | 12/1981 | Mogi | 341/26 |
| 4,335,374 | 1/1982 | Nyuji | 364/707 |
| 4,502,038 | 2/1985 | Lowenthal et al. | 341/26 |
| 5,235,331 | 8/1993 | Sato | 341/26 |
| 5,280,283 | 1/1994 | Raasch et al. | 341/26 |

*Primary Examiner*—Brent A. Swarthout
*Assistant Examiner*—Ashok Mannava
*Attorney, Agent, or Firm*—Limbach & Limbach

[57] ABSTRACT

A keypad encoder is used with a keypad having an array of keys arranged in columns and rows. Depressing any key on the keypad closes a corresponding switch, coupling one of the columns to one of the rows. The keypad encoder includes a resettable logic circuit that generates a control signal having first and second states that control the mode of operation of the keypad encoder. A scanning circuit asserts a scanning signal on the columns of the keypad in a predefined sequence when the control signal is in the first state and asserts the scanning signal on all of the columns of the keypad simultaneously when the control signal is in the second state. An encoder circuit identifies which row, if any, has a closed switch in any of the keypad columns on which the scanning circuit has asserted the scanning signal. The encoder circuit also activates a keydown signal whenever any switch in any of the keypad columns on which the scanning circuit has asserted the scanning signal is closed and deactivates the keydown signal when none of the switches in any of the keypad columns on which the scanning circuit has asserted the scanning signal is closed. After a depressed key is sensed, its identity is stored in an output circuit, the control signal is put in the second state and the scanning circuit stops scanning the keypad. The scanning circuit resumes scanning the keypad only after another depressed key is detected by the encoder circuit.

18 Claims, 7 Drawing Sheets

ULTRA-LOW POWER, SCAN ON DEMAND KEYPAD ENCODER

This is a continuation of application Ser. No. 08/293,818 filed Aug. 22, 1994, now abandoned.

The present invention relates generally to keyboard and keypad encoders, and particularly to a keypad encoder that uses substantially less power than conventional keypad encoders. Keypad encoders are devices that detect keys pressed on keyboards and send data identifying the pressed keys to another device, such as a computer or other digital data processing device.

BACKGROUND OF THE INVENTION

Referring to FIG. 1, keypads and keypad encoders are used in many types of electronic equipment where an operator or user of the equipment gives the equipment instructions, sets the equipment's mode, and/or enters information into the equipment through the use of a keypad. A keypad is typically a small version of a keyboard, typically having 16 to 32 keys, and usually having fewer keys than the 84 to 105 or more keys found on computer keyboards.

In a typical keypad application, the system 50 includes a keypad 52, a keypad encoder 54, a microcontroller 56 or other electronic circuit that receives digitized information from the keypad encoder 54, and a controlled system 60. The keypad encoder 54 is a device that scans the keypad, determines which, if any, keys are depressed, and outputs a digital value that identifies the depressed key.

The controlled system 60 may be a transmitter, a machine on a factory floor, an automated teller machine, or any other electronic equipment utilizing a keypad for user control. In many such applications, the entire system is powered by a battery 62, and thus it is important to minimize energy usage by the entire system 50, and in particular it is important to minimize energy usage while the system is dormant (i.e., inactive but not powered off).

In the prior art, the keypad encoder 54 consumes power even while a system 50 is dormant because it continuously scans the keypad for depressed keys. In fact, 99% of the power used by many keypad encoders is used scanning while no keys are depressed, and only 1% is used for actually identifying depressed keys.

The present invention is an improvement of keypad encoders made by National Semiconductor under the product names MM74C922 and MM74C923. Those keypad encoders continuously scan a keypad for depressed keys. The present invention is similar in many respects to the aforementioned keypad encoders. However, in the present invention the keypad is scanned only when a key is depressed. Power is saved by (A) disabling the oscillator that drives the keypad's scanning circuitry except when a key has been pressed, and (B) disabling the keypad scanning circuitry except for a very short period of time when a key has been pressed. The disabling of the scanning circuitry is the primary manner in which power is saved.

Another aspect of the present invention is that the scanning circuit is adapted to enable all the keypad columns simultaneously when the circuit is in the dormant mode so as to enable detection of any key press without having to scan the keypad. An enable and reset circuit, coupled to encoder logic, detects new key presses, enables the oscillator and scanning circuits, and turns off the oscillator and scanning circuits after the depressed key has been identified and its identity has been latched in an output latch.

Yet another aspect of the present invention is that the keypad encoder's "scan on demand" circuitry is adapted to allow scanning and encoding of "rolling" key presses, in which a second key is pressed before a previously pressed key is released. While this is not a problem for a continuous scanning encoder, a feature of the present invention is that the scanning of the keypad will be automatically resumed if a second key is pressed before the previously pressed key is released.

SUMMARY OF THE INVENTION

In summary, the present invention is a keypad encoder used with a keypad having an array of keys arranged in columns and rows. Depressing any key on the keypad closes a corresponding switch and couples one of the columns to one of the rows. The keypad encoder includes a resettable logic circuit that generates a control signal having first and second states that control the mode of operation of the keypad encoder. An oscillator generates a clock signal. A scanning circuit asserts a scanning signal on the columns of the keypad in a predefined sequence when the control signal is in the first state and asserts the scanning signal on all of the columns of the keypad simultaneously when the control signal is in the second state.

An encoder circuit, coupled to the rows of the keypad, generates a first signal identifying which of the rows, if any, has a closed switch in any of the keypad columns on which the scanning circuit has asserted the scanning signal. The encoder circuit also activates a keydown signal whenever any switch in any of the keypad columns on which the scanning circuit has asserted the scanning signal is closed and deactivates the keydown signal when none of the switches in any of the keypad columns on which the scanning circuit has asserted the scanning signal is closed.

After a depressed key is sensed, the control signal is put in the first state, causing the scanning circuit to scan the keypad until the row associated with the depressed key is identified by the encoder circuit. The depressed key's column and row identification is stored in an output circuit, and the control signal is put in the second state after the depressed key is released. The scanning circuit stops scanning the keypad once the depressed key is identified by the encoder circuit and the scanning circuit's scanning operation is disabled when the control signal is in the second state. The scanning circuit resumes scanning the keypad only after another depressed key is detected by the encoder circuit.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Since the present invention uses much of the same circuitry as the MM74C922 keypad encoder made by National Semiconductor, that circuit will be described first, and then the differences between that continuous scanning keypad encoder and the present invention will be described.

MM74C922 KEYPAD ENCODER

Figure 2:
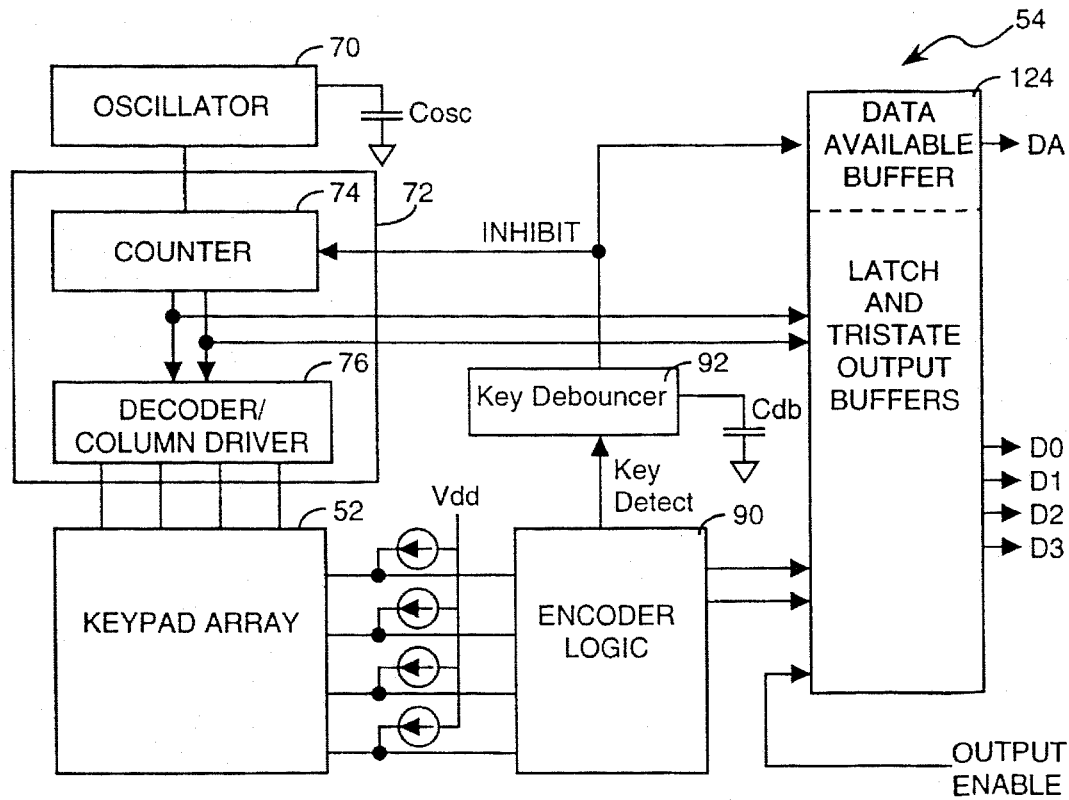
FIG. 2 is a block diagram of a prior art keypad and keypad encoder.
Figure 3:
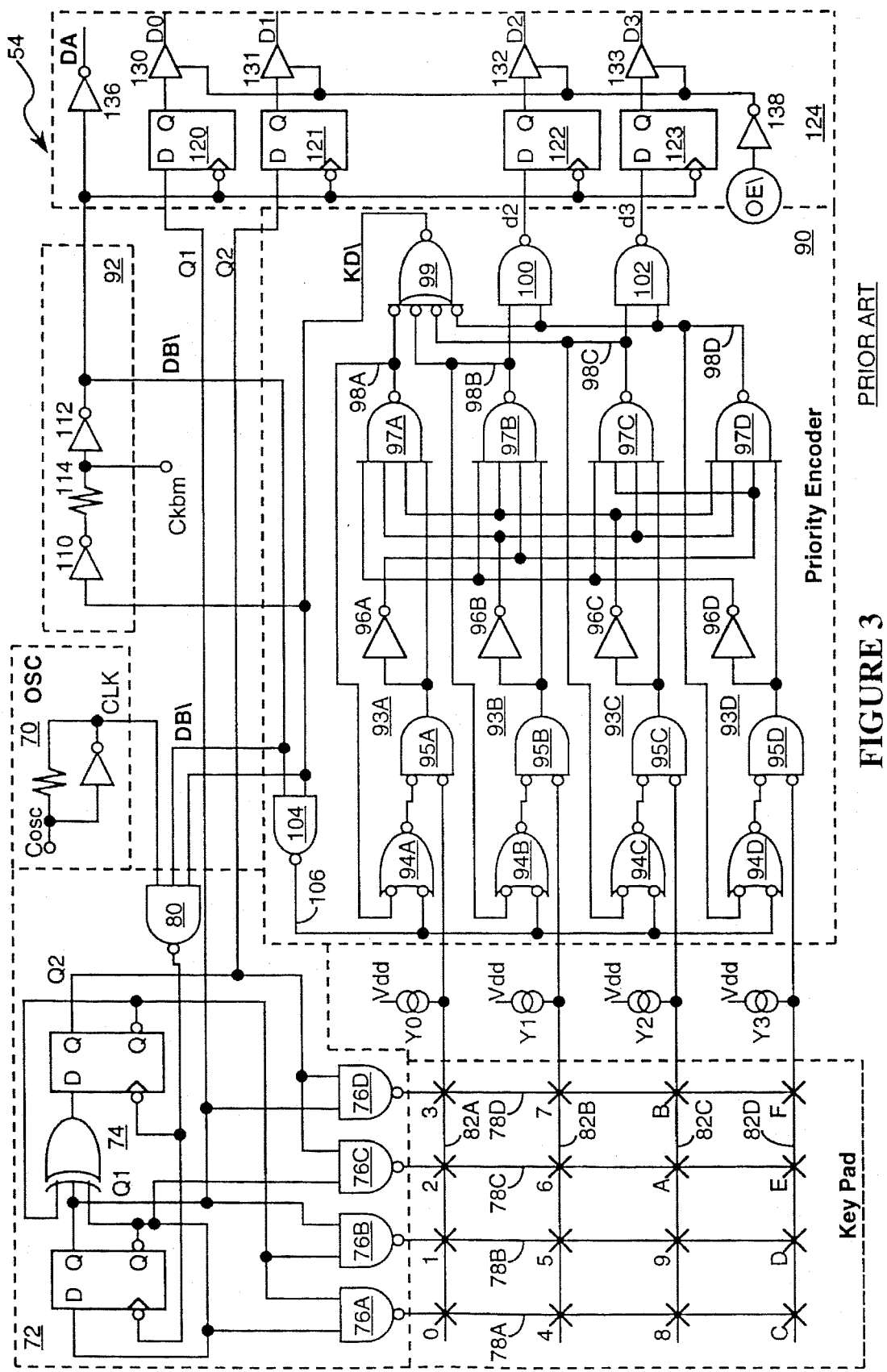
FIG. 3 is a detailed logic level circuit schematic of the prior art keypad and keypad encoder shown in FIG. 2.

FIG. 2 is a block diagram and FIG. 3 is a detailed logic circuit diagram of the MM74C922 keypad encoder made by National Semiconductor. For simplicity, we have selected a keypad encoder for a small (16-key) keypad as an example of prior art continuous scanning keypad encoders. The prior art keypad encoder 54 includes an oscillator circuit 70 and a keypad scanning circuit 72. The oscillator circuit 70 is a typical simple oscillator circuit whose frequency is controlled by a capacitor $C_{OSC}$ that is external to the integrated circuit in which the keypad encoder is implemented. The oscillator circuit 70 generates a periodic clock signal CLK that typically has a frequency of less than 10 KHz, and usually has a frequency of 500 to 2000 Hz.

The keypad scanning circuit 72 includes a counter 74, and a decoder and column driver circuit 76. The counter 74 in this example is a simple two stage counter that counts from 0 to 3 in increments of 1, and then repeats that sequence. The counter 74 outputs a two bit signal representing the counter's current count value. The decoded/driver circuit 76 is a set of four NAND gates 76A–76D, each coupled to a corresponding one of the four columns 78A–78D of switches in the keypad's switch array. The NAND gates 76A–76D preferably have open-drain outputs that can pull their respective output nodes to a logic low voltage level (typically 0 volts, often designated as Vss) but cannot pull up the voltage of their respective output nodes. Because each of the NAND gates 76A–76D is coupled to a unique combination of the counter output signals, only one of the driver circuit gates is activated at any one time, and thus only one column of the keypad switches is scanned for depressed keys at any one time. In particular, with each cycle of the CLK signal from the oscillator 70, the counter 76 increments its output value by one. The counter circuit 74 includes an inhibit gate 80 that blocks the clock signal CLK from incrementing the counter whenever either the "keydown" signal KD\ or the debounced keydown signal DB\ is active (low). The purpose and generation of the keydown and debounced keydown signals are explained below.

The four rows 82A–82D of switches in the keypad array are coupled to four current sources Y0–Y3 that cause the row connectors to be at a logic high voltage level (e.g., the power supply voltage, which is typically between 3.2 and 15 volts) unless a keypad switch on the row is closed and the closed switch is coupled to an active column (whose voltage is being pulled low by a corresponding one of the column driver NAND gates 76A–76D).

Thus, whenever no keys are depressed, the counter 74 changes output values at a fixed rate, such as 1000 times per second (assuming a clock rate of 1000 Hz), and thus a next one of the column driver NAND gates is activated and a new one of the keypad columns is activated 1000 times per second. As a result, all the columns of the keypad are scanned 250 times per second.

Whenever a key is depressed, the switch under the depressed key is closed and the corresponding row line 82A–82D will transition to a low logic level voltage the next time that the column corresponding to the depressed key is activated by the counter 74.

Next, we consider the operation of the encoder circuit 90 and the debounce circuit 92. The encoder circuit 90 includes four sensor circuits 93A–93D, each of which includes (going from left to right in FIG. 3) a NOR gate 94, an AND gate 95 an inverter 96 and a NAND gate 97. Each of these four sensor circuits outputs a low signal on a respective one of nodes 98A–98D when the row input to the sensor is active (i.e., low). A four-input NOR gate 99 receives the four sensor outputs on nodes 98A–98D and outputs an active (low) signal called "keydown" KD\ when any of the four sensor circuits 93A–93D detects a depressed key.

In this document, "negative logic signals" (which are signals that are at a low logic voltage level when active) are indicated by a signal name with a backslash at the end. Thus the backslash at the end of the signal name KD\ indicates that KD\ is a negative logic signal.

The first gate 94 of each sensor circuit 93 acts as an enable/lockout gate for the sensor: when either the keydown KD\ input to gate 94 or the sensor feedback signal on node 98 of the sensor is at a logic low level, the sensor circuit is enabled. When both the inputs to gate 94 are at a logic high voltage, the sensor circuit 93 locked out. More particularly, once a depressed key is sensed by any one of the sensor circuits, the other sensor circuits are locked out until the keydown signal KD\ returns to a logic high voltage.

NAND gates 100 and 102 form a two gate encoder that outputs a two-bit value "d3,d2" representing which of the four sensors has sensed a depressed key:

| d3,d2 | Circuit Condition |
|---|---|
| 1,1 | sensor 93D senses a depressed key |
| 1,0 | sensor 93C senses a depressed key |
| 0,1 | sensor 93B senses a depressed key |
| 0,0 | sensor 93A senses a depressed key, or no sensor senses a depressed key |

Consider the operation of one sensor 93B starting with no keypad keys depressed. All the row nodes 82A–82D will be at logic high voltages, thereby causing all the sensor output nodes 98A–98D to be at logic high voltages. As a result, the keydown signal KD\ will also at a logic high voltage and NAND gates 100 and 102 will output a d3,d2 value equal to 0,0. When any key on row 82B is depressed, the voltage on row 82B will remain high until the scanning circuit 72 activates the line driver 76 for the column corresponding to the depressed key, whereupon the voltage on row 82B will be pulled to a logic low voltage by the line driver 76 for that column. The low voltage on row 82B will cause the voltage on node 98B to transition to the logic low level, thereby causing NOR gate 99 to generate an active low keydown signal KD\ and causing NAND gate 100 to generate a logic high voltage for signal d2 (i.e., d3,d2 will equal 0,1).

The activated (low) KD\ signal will cause NAND gate 104 to assert a high voltage on node 106, thereby locking out all the sensor circuits other than the first one to detect a depressed key.

The activated (low) keydown signal KD\ is also received by NAND gate 80 in the counter circuit 74. The low signal level of the activated KD\ signal blocks the clock signal CLK from clocking the counter, and thus the activated keydown signal KD\ stops the counter circuit 74 while its output activates the column driver 76 for the column containing the depressed key.

The debounce circuit 92 constitutes a low pass filter and integrator having two inverters 110, 112 and an RC filter 114. The debounce circuit generates a delayed and debounced version of the keydown signal KD\ called DB\. An external integrating capacitor, $C_{KBM}$, is used as part of the debounce circuit. The external capacitor's capacitance is selected so that a key must remain depressed for about 10 clock cycles (i.e., typically 5 to 20 milliseconds) before the debounce circuit will generate an active (low) DB\ signal.

Figure 1:
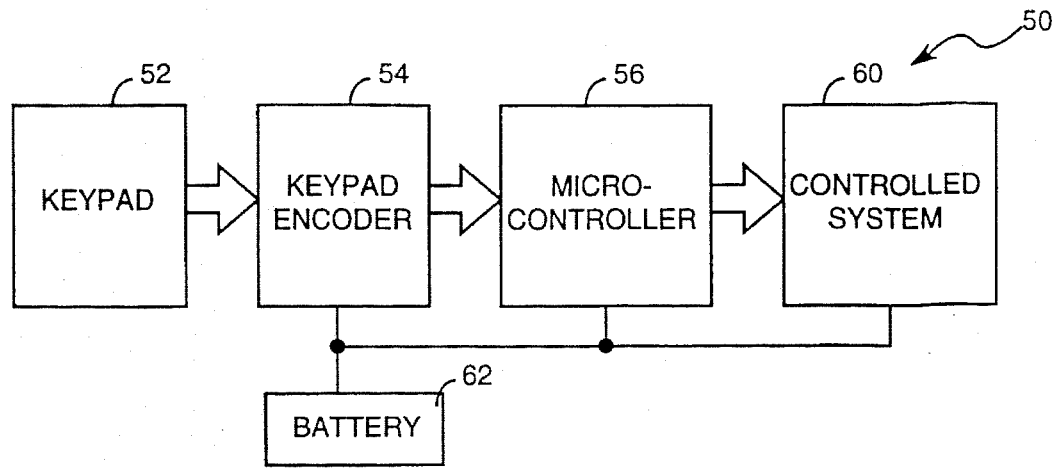
FIG. 1 is a block diagram of a typical electronic circuit in which a keypad and keypad encoder are used.

The debounce keydown signal DB\ is used in several places in the keypad encoder circuit 54. First, it is used to keep the counter 74 in the scanning circuit 72 inhibited for approximately 10 clock cycles after a depressed key is released, and it is also used to inhibit operation of the key sensors 93A–93D for a similar period of time. In addition, the falling edge of the DB\ signal is used to latch the counter value Q2, Q1 and the sensor value d3,d2 into four latches 120–123 in the output circuit 124, and to generate a Data Available signal DA to indicate to an external device (e.g., microcontroller 56 in FIG. 1) that the output circuit is holding data identifying a depressed key.

The output circuit 124 includes, in addition to the aforementioned latches 120–123, four tristate buffers 130–133 that transmit the data stored in latches 120–123 as signals D0–D3 when an Output Enable signal OE\ is received from an external device. The tristate buffers 130–133 assume a high impedance output state when they are not enabled. The output circuit 124 further includes an inverter 136 for generating the Data Available signal DA, and an inverter 138 for converting the receive OE\ signal into an enable signal for the tristate buffers 130–133.

Next we consider "rollover" operation of the keypad encoder 54 shown in FIGS. 2 and 3. When a user presses a first key and then presses a second key before releasing the first key, or while releasing the first key, the keypad encoder 54 works as follows. While the first key remains depressed, the scanning circuit 72 will remain locked on the keypad column for the first key.

If the second key is in a different column from the first key, when the first key is released the sensor that detected the first key will output a no-detect (high) signal on its output node 98x, where 98x represents one of 98A–98D, thereby causing the keydown signal KD\ to be disabled (i.e., high). When KD\ goes high, that enables all the sensor circuits 93A–93D, although the scanning circuit will remain locked because the debounce signal DB\ has not yet been released. After the debounce signal DB\ is released (i.e., goes high), the scanning circuit will sequentially enable each of the column drivers 76A–D until the column with the second key is activated. That will cause the row sensor circuit corresponding to the second key to sense a pressed key, and from there the encoder circuit 54 works in the same manner as described above for a normal single key press. If the second key is in the same column as the first key, the rollover function doesn't work. That is, all depressed keys in a column must be released before depression of a second key in the same column can be detected. More particularly, if a second key in the same column is pressed before the first key is released, and then the first key is released, that will cause the keydown signal KD\ to be disabled (i.e., high), which in turn will enable all the sensor circuits 93A–93D. The scanning circuit will remain locked because the debounce signal DB\ has not yet been released. A new one of the sensor circuits will detect the second key and thus will output a detect signal on its output node 98y, where 98y represents one of 98A–98D. That will re-activate the keydown signal KD\. However, the keydown signal KD\ will have been deactivated for only a very short period of time (typically a few tens of nanoseconds) and thus the debounce signal will remain activated, and thus the Data Available signal DA will not cycle up and down. As a result of the failure of the DA to cycle up and down, the new key identification data will not be stored in latches 122, 123, and the external circuit will not be prompted to retrieve data for the second key. Thus, when the second key is in the same column as the first key, the rollover function does not work.

Since the keys of small keypads are usually pressed with the fingers of just one hand, and since pressing two keys in the same column with the fingers of one hand is sufficiently awkward that it rarely happens by accident, the inability of the keypad encoder to handle rollover keypresses in a single column is generally not a commercially significant problem.

SCAN ON DEMAND KEYPAD ENCODER

Figure 4:
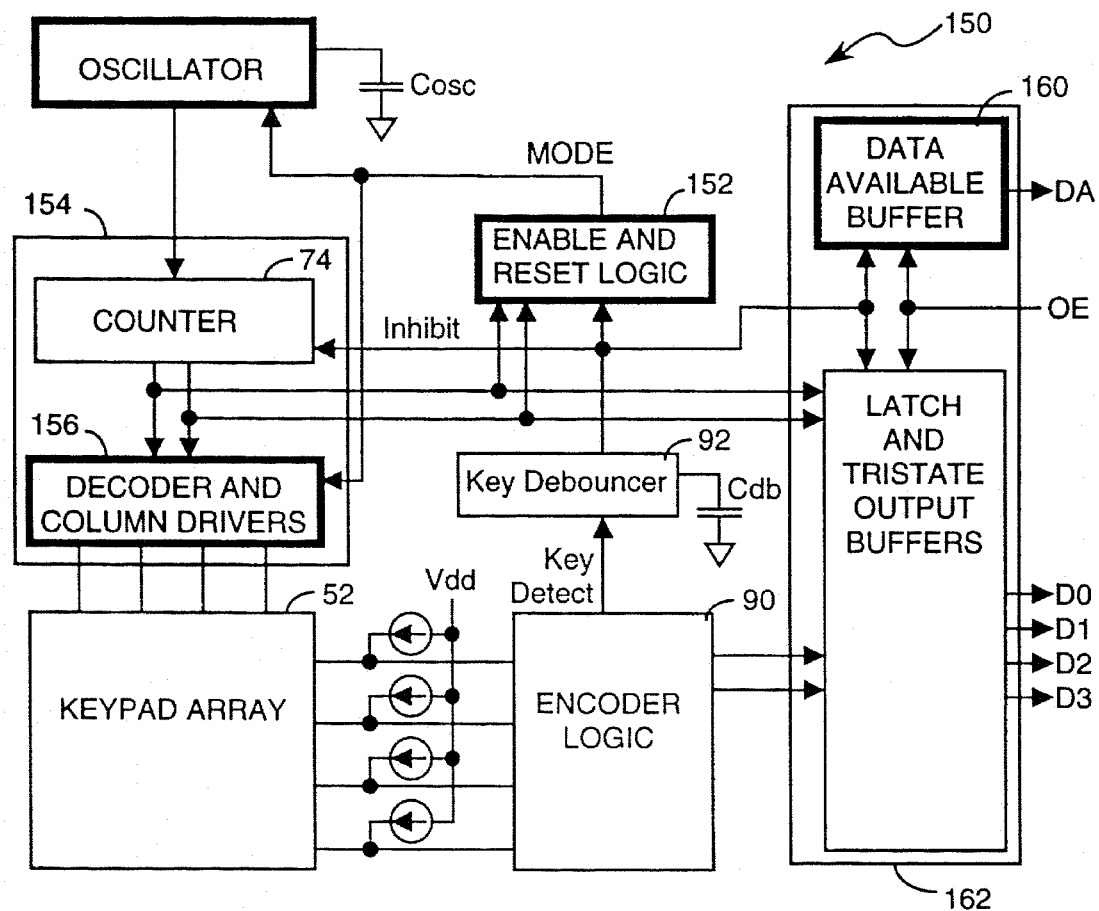
FIG. 4 is a block diagram of the keypad and keypad encoder of the present invention.
Figure 5A:
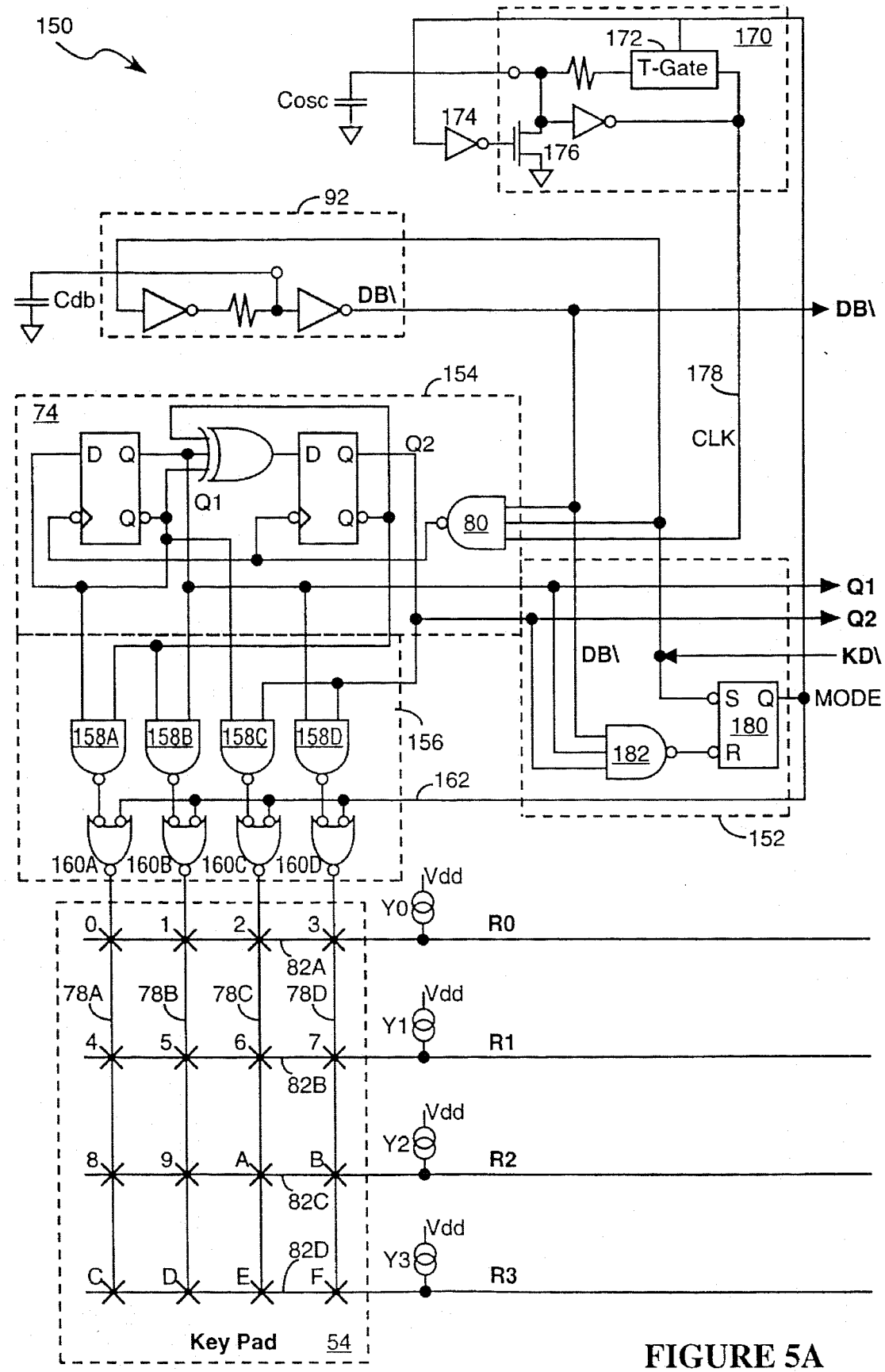
FIGS. 5A and 5B show a detailed logic level circuit schematic of the keypad and keypad encoder of the present invention.
Figure 5B:
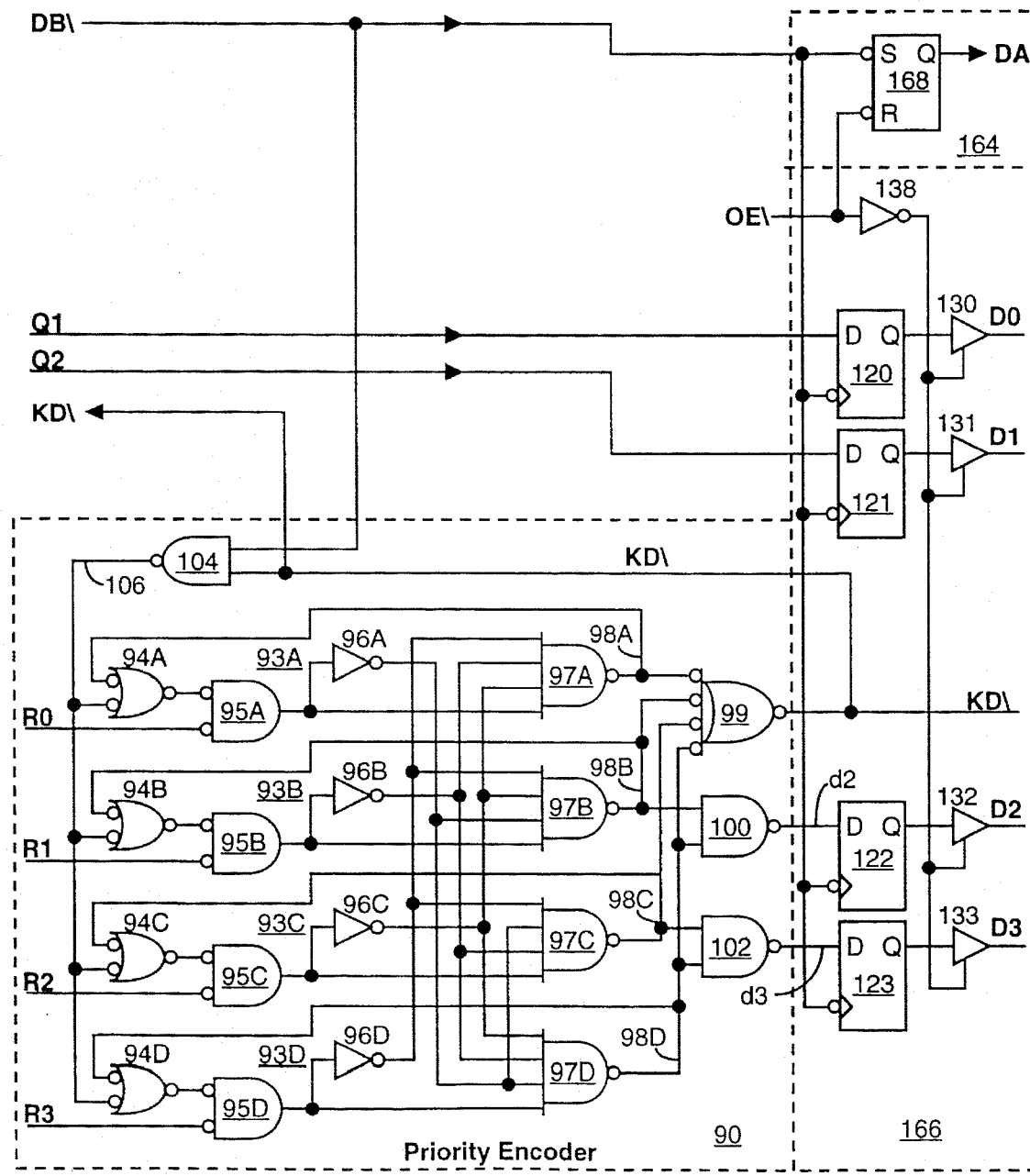

Referring to FIGS. 4 and 5, the preferred embodiments of the keypad encoder 150 of present invention will be described by describing the differences between the preferred embodiments and the keypad encoder 54 of FIGS. 2 and 3. As an initial matter, it is noted that the keypad 52 itself, the counter 74, the encoder circuit 90 and the debounce circuit 92 are unchanged.

The basic mode of operation of the scan on demand keypad encoder 150 is as follows. A resettable logic circuit 152 generates a control signal called MODE having first and second states (1 and 0) that control the mode of operation of the keypad encoder. A scanning circuit 154 asserts a scanning signal on the columns of the keypad 52 in a predefined sequence when the control signal MODE is in the first state, and asserts the scanning signal on all of the columns of the keypad simultaneously when the control signal is in the second state. The encoder circuit 90, coupled to the rows of the keypad, generates a signal identifying which of the rows, if any, has a closed switch in any of the keypad columns on which the scanning circuit has asserted the scanning signal. The encoder circuit 90 also activates a keydown signal KD\ whenever any switch in any of the keypad columns on which the scanning circuit has asserted the scanning signal is closed and deactivates the keydown signal KD\ when none of the switches in any of the keypad columns on which the scanning circuit 154 has asserted the scanning signal is closed.

After a depressed key is sensed, the control signal MODE is put in the first state, causing the scanning circuit 154 to scan the keypad until the row associated with the depressed key is identified by the encoder circuit. The depressed key's column and row identification is stored in an output circuit 166, and the control signal MODE is put in the second state after the depressed key is released. The scanning circuit stops scanning the keypad once the depressed key is identified by the encoder circuit and the scanning circuit's scanning operation is disabled when the control signal is in the second state. The scanning circuit 154 resumes scanning the keypad only after another depressed key is detected by the encoder circuit 90.

We will now consider the operation of the scan on demand keypad encoder 150 in more detail.

Dual Mode Scanning Circuit

The column driver circuit 156 of the new keypad encoder 150 includes a set of four standard NAND gates 158A–158D and a set of four open-drain NOR gates 160A–160D that serve as column line drivers. The line driver NOR gates 160A–160D have inverted inputs and can only pull their output nodes down, but cannot pull those output nodes high.

The column line drivers (NOR gates) 160 each have an input coupled to node 162 which carries the previously mentioned control signal MODE. When no keys on the keypad are depressed and thus the keypad encoder is not processing a depressed key, the control signal MODE on node 162 is low, thereby activating all the column line drivers 160A–160D. It should be noted that activating the column line drivers uses virtually no power, except when a key is pressed because activating the column line drivers simply holds the column lines at a low voltage, which uses no power if no current is being drawn by the column lines (i.e., from current sources Y0–Y3).

Data Available Buffer

The Data Available buffer 164 in the output circuit 166 differs from the corresponding portion of the keypad encoder circuit shown in FIGS. 2 and 3. In particular, the data available signal DA is generated by an RS latch 168 that is set whenever the debounce signal DB\ is low, and is reset when the externally generated Output Enable signal OE\ is low and DB\ is high. The external device must hold the OE\ signal low until the DA signal goes high, thereby ensuring that the debounce signal DB\ goes high before the output enable signal OE\ is deasserted by the external device.

On/Off Oscillator Circuit

The oscillator circuit 170 differs from the corresponding portion of the keypad encoder circuit shown in FIGS. 2 and 3. In particular, the oscillator 170 has includes a gate 172 controlled by the MODE signal such that the gate 172 is closed when the MODE signal is high and the gate is open when the MODE signal is low. Since the gate 172 is in the oscillator's loop, when the gate is open (and MODE is low), the oscillator is turned off. Furthermore, the oscillator 170 includes an inverter 174 whose input is coupled to the MODE signal line 162 and an enhancement mode NMOS transistor 176 gated by the inverter's output. The purpose of the inverter 174 and NMOS transistor 176 is to set the CLK line 178 to a known state (i.e., the high logic voltage) when the MODE signal is low and the scanning circuit is in its non-scanning mode.

Resettable Logic Circuit

The purpose of the resettable logic circuit 152 is to generate the MODE control signal on line 162, which in turn controls the mode of operation of the oscillator 170 and the scanning circuit 156. The output generated by RS latch 180 is the MODE signal on line 162. NAND gate 182 has three inputs: the Q2 and Q1 outputs of the counter 74, and the DB\ debounce signal. The output of the NAND gate 182 is coupled to the reset input R of the RS latch 180.

RS latch 180 is set whenever the keydown signal KD\ is low, and is reset whenever the debounce signal DB\ is high and the counter 74 generates an output value of Q2, Q1="1, 1". Thus, the MODE signal is put in a first state (i.e., "1" or the high logic voltage state) when a depressed key is sensed by the encoder 90 (which causes the keydown signal KD\ to be pulled low), and the MODE signal is put in the second state (i.e, "0") after the depressed key is released, which causes the debounce signal DB\ to return to the high logic voltage, which in turn allows the counter 74 to count up to the "1,1" output value if the counter was not already at that count value.

Timing Diagram

Figure 6:
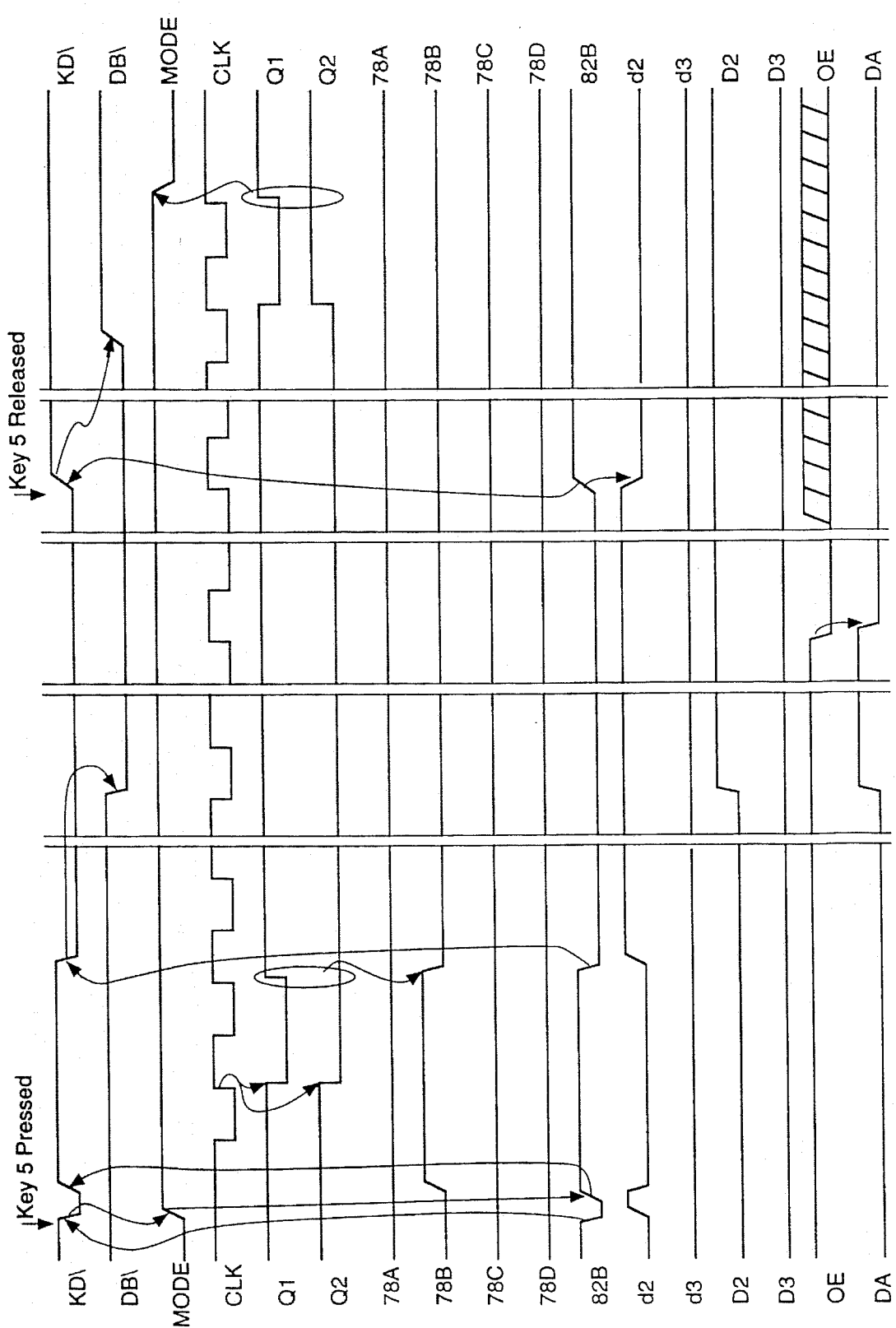
FIG. 6 is a timing diagram for the circuit shown in FIG. 5.

FIG. 6 shows the operation of the scan on demand keypad encoder when Key 5 (second column, second row from the top left corner of the keypad) is pressed and then released. Please note that FIG. 6 is meant to show cause and effect relationships and action sequences and is not meant to accurately represent the amount of time between various circuit actions.

Since all the column drivers 160 are initially on, the key press initially pulls row line 82B low, which causes the encoder circuit 90 to detect the key press and to pull the keydown signal KD\ low and to assert output signal d2. The low keydown signal KD\ sets the MODE signal high, which in turn disables all the column drivers 160 except the one for column 78D (the counter 74 is always left with a count value of "1,1" when the MODE is reset low).

The disabling of the column driver 160B for column 78B causes row line 82B to be pulled back to a high voltage by its current source Y1, which in turn causes the encoder circuit 90 to pull the keydown signal KD\ to a high voltage. At this point, the MODE signal has been put in the first state (high), and thus the oscillator 170 and counter circuits 74 are enabled. The counter 74 increments its output until the column driver 160B corresponding to the pressed key is enabled, which causes row line 82B to be pulled low, which in turn causes the encoder circuit 90 to pull the keydown signal KD\ low and to assert output signal d2.

After the keydown signal KD\ has been low for about ten clock cycles, the debounce circuit 92 pulls the DB\ signal low. The falling edge of the DB\ signal latches the key identification data (Q1, Q2, d2, d3) into the output latches and also causes the RS latch 168 to generate the data available signal DA.

When the external circuit asserts the output enable signal OE\ (i.e., pulls OE\ low), the data available signal DA is reset. When key 5 is released, the corresponding row line signal R1 is pulled back high by its current source Y1, causing the encoder circuit to pull the keydown signal KD\ back high. After the keydown signal KD\ has been high for about ten clock cycles, the debounce circuit 92 pulls the DB\ signal high. When both KD\ and DB\ are at the high logic voltage level, the counter 74 resumes the process of incrementing its output value until it reaches an output value of "1,1". When the counter reaches the "1,1" output value, the MODE signal is reset by the resettable logic circuit 152 to a low logic level, thereby returning the scan on demand circuit to its dormant state (i.e., with the oscillator and scanning circuits disabled). The counter 74 is left with a Q2,Q1="1,1" output value when the processing of a key stroke is completed and the circuit returns to its dormant state.

ALTERNATE EMBODIMENTS

Early DA Off Circuit

Figure 7:
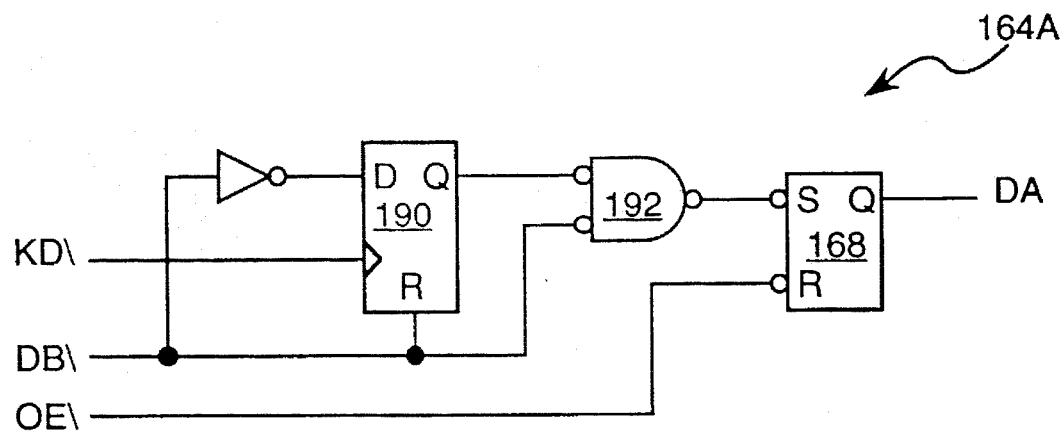
FIG. 7 is logic level circuit diagram for an alternate version of a data available buffer for use in the keypad encoder of FIG. 5.

In an alternate preferred embodiment of the present invention, the Data Available buffer 164 shown in FIG. 5 is replaced by the circuit shown in FIG. 7. The purpose of the "early DA off circuit buffer" 164A is to turn the DA signal off (i.e., low) earlier than is the case with the embodiment of FIG. 5 when the output enable signal OE\ is asserted prior to the debounce signal DB\ being deasserted. Since many external devices will assert OE\ low within ten milliseconds or so of the DA signal being asserted, the DB\ signal will usually still be held low when OE\ is asserted low, causing the latch 168 to remain in the true (output "1") state.

The early DA off circuit 164A includes an additional latch 190 that stores a logical "0" whenever the debounce signal DB\ is high, as is the case while no keys are being pressed. When, after a key press, the debounce signal DB\ follows the keydown signal to a low voltage, NAND gate 192 is enabled, which sets the DA latch 168 to output a "1" (logic high voltage) on the DA signal line. When the key is released and keydown signal KD\ rises to a high voltage, the debounce signal DB\ is still low and thus latch 190 stores a "1", which causes the NAND gate 192 to output a high signal. If the output enable signal OE\ is asserted after the keydown signal KD\ rises to a high voltage, but before the debounce signal DB\ rises to a high voltage, the DA signal is reset to a low voltage before the DB\ rises to a high voltage. If the output enable signal OE\ is asserted before the key is released, the DA signal is reset to a low voltage just a few gate delays (typically less than 100 nanoseconds) after the key is released, and thus DA is reset well before the DB\ signal returns to a high voltage.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A keypad encoder for use with a keypad having an array of keys coupled to switches arranged in columns and rows such that depressing any key on the keypad closes a corresponding switch that couples one of said columns to one of said rows; said keypad encoder comprising:

an encoder circuit, coupled to said rows of said keypad, that activates a keydown signal whenever any switch in any of said keypad columns is closed and deactivates said keydown signal when none of said switches in any of said keypad columns is closed;

a resettable logic circuit that generates a control signal, said control signal having first and second states, said resettable circuit putting said control signal in said first state whenever said keydown signal is activated by said encoder circuit, and setting said control signal in said second state after said keydown signal is deactivated by said encoder circuit, said resettable logic circuit putting said control signal in said first state when a second switch from a second column is pressed before said closed switch from a first column different from said second column has been released;

a scanning circuit, coupled to said columns of said keypad, that asserts a scanning signal on said columns of said keypad in a predefined sequence only when said control signal is in said first state, said scanning circuit coupled to each of said columns by a column driver so that said column drivers are active as long as said control signal is not in said first state, said column drivers when active maintaining said columns at a low voltage level so as to minimize energy usage by said column driver and to minimize energy usage by said keypad encoder when said control signal is not in said first state;

said encoder circuit including circuitry that generates a key identification signal identifying which of said rows, if any, has a closed switch in any of said keypad columns on which said scanning circuit has asserted said scanning signal; and an output circuit, coupled to said encoder circuit, that stores and outputs signals identifying said closed switch;

said scanning circuit including logic for stopping said scanning circuit whenever said keydown signal is activated so as to stop said scanning circuit while it is still generating the scanning signal corresponding to the column having said closed switch; said scanning circuit resuming scanning said columns of said keypad when said closed switch is released and said second switch in said second column was pressed before said closed switch from said first column different from said second column has been released;

wherein when any first key is pressed and then any second key in a different column from said first column is pressed before said first key is released, and then said first key is released prior to said second key is released; said scanning circuit stops scanning while generating the scanning signal corresponding to said first column, resumes scanning after said first key is released and then stops scanning a second time while generating the scanning signal corresponding to said second column, and said encoder circuit generates two successive key identification signals identifying said first key and then said second key.

2. The keypad encoder of claim 1, including a debounce circuit that low pass filters and integrates said keydown signal to generate a debounce signal that is delayed with respect to said keydown signal; said debounce circuit activating and deactivating said debounce signal at circuitry determined delays after said keydown signal is activated and deactivated, respectively;

said scanning circuit including a counter that generates count signals in a sequence corresponding to said predefined sequence;

said resettable logic circuit including logic for setting said control signal to said second state when said debounce signal is deactivated and said counter generates count signals having a predefined count value.

3. The keypad encoder of claim 2 including an early DA off circuit buffer that activates a data available signal when said signals identifying said closed switch are ready to be read by an external device, said DA off circuit buffer deactivating said data available signal before said debounce signal is deactivated and after the later event of said keydown signal being deactivated, indicating said key has been released, and an output enable signal being asserted by an external device, indicating said signals identifying said closed switch have been read by said external device.

4. The keypad encoder of claim 1, including an oscillator that generates a clock signal, said oscillator including gate circuitry that disables said oscillator from generating said clock signal while said control signal is in said second state.

5. The keypad encoder of claim 1 wherein said column driver is a two input NOR gate with an open-drain configuration, a first of said inputs being an inverted version of said control signal and a second of said inputs being an inverted version of said scanning signal.

6. A keypad encoder for use with a keypad having an array of keys coupled to switches arranged in columns and rows such that depressing any key on the keypad closes a corresponding switch that couples one of said columns to one of said rows; said keypad encoder comprising:

a scanning circuit, coupled to said columns of said keypad by a plurality of column drivers, each said column driver corresponding to one of said columns, that asserts a scanning signal on said columns of said keypad in a predefined sequence when said scanning circuit is operated in a first mode and that asserts said scanning signal on all of said columns of said keypad simultaneously when said scanning circuit is operated in a second mode, said column drivers minimizing energy consumption of said keypad encoder when said scanning circuit is operated in said second mode;

an encoder circuit, coupled to said rows of said keypad, that generates a first signal identifying which of said rows, if any, has a closed switch in any of said keypad columns on which said scanning circuit has asserted said scanning signal, and that activates a keydown signal whenever any switch in any of said keypad columns on which said scanning circuit has asserted said scanning signal is closed and deactivates said keydown signal when none of said switches in any of said keypad columns on which said scanning circuit has asserted said scanning signal is closed;

an output circuit, coupled to said encoder circuit, that stores and outputs signals identifying said closed switch; and a resettable logic circuit that generates a control signal, said control signal having first and second states, said control signal putting said scanning circuit in said first mode when said control signal is in said first state and putting said scanning circuit in said second mode when said control signal is in said second state; said resettable circuit putting said control signal in said first state whenever said keydown signal is activated by said encoder circuit, and setting said control signal in said second state after said keydown signal is deactivated by said encoder circuit, said resettable logic circuit thereby minimizing energy consumption of said keypad when said keypad is waiting for said keydown signal to be activated by said encoder circuit; said resettable logic circuit putting said control signal in said first state when a second switch from a second column is pressed before said closed switch from a first column different from said second column has been released;

wherein said keypad encoder generates two successive key identification signals at non-overlapping times when any first key is pressed and then any second key in a different column from said first column is pressed before said first key is released, and then said first key is released prior to when said second key is released, said encoder circuit generating a first key identification signal identifying said first key while said first key remains pressed and generating a second key identification signal identifying said second key only after said first key is released.

7. The keypad encoder of claim 6, including a debounce circuit that low pass filters said keydown signal to generate a debounce signal that is delayed with respect to said keydown signal; said debounce circuit activating and deactivating said debounce signal at circuitry determined delays after said keydown signal is activated and deactivated, respectively;

said scanning circuit including a counter that generates count signals in a sequence corresponding to said predefined sequence;

said resettable logic circuit including logic for setting said control signal to said second state when said debounce signal is deactivated and said counter generates count signals having a predefined count value.

8. The keypad encoder of claim 7, including an oscillator that generates a clock signal, said oscillator including gate circuitry that disables said oscillator from generating said clock signal while said control signal is in said second state.

9. The keypad encoder of claim 7 including an early DA off circuit buffer that activates a data available signal when said signals identifying said closed switch are ready to be read by an external device, said DA off circuit buffer deactivating said data available signal before said debounce signal is deactivated and after the later event of said keydown signal being deactivated, indicating said key has been released, and an output enable signal being asserted by an external device, indicating said signals identifying said closed switch have been read by said external device.

10. The keypad encoder of claim 6, including an oscillator that generates a clock signal, said oscillator including gate circuitry that disables said oscillator from generating said clock signal while said control signal is in said second state.

11. A keypad encoder for use with a keypad having an array of keys coupled to switches arranged in columns and rows such that depressing any key on the keypad closes a corresponding switch that coupled one of said columns to one of said rows; said keypad encoder comprising:

an oscillator that generates a clock signal;

a scanning circuit that scans said columns of said keypad, said scanning circuit including a counter circuit driver that generates a sequence of column selection signals, said counter circuit coupled to said oscillator so as to generate a new column selection signal in synchronization with said clock signal; and a driver circuit that activates a selected one of said columns of switches in said keypad in accordance with said column selection signal;

an encoder circuit, coupled to said rows of said keypad, that generates a first signal identifying which of said rows, if any, has a closed switch in an activated column, and that activates a keydown signal whenever any switch in any activated column is closed;

said counter circuit including a logic gate for stopping said counter circuit whenever said keydown signal is activated so as to stop said counter circuit While it is still generating the column selection signal corresponding to the column having said closed switch;

a debounce circuit that activates a debounce signal after said keydown signal has been activated for a debounce delay period and for deactivating said debounce signal after said keydown signal is deactivated;

an output circuit that stores and outputs signals identifying said closed switch; and a resettable logic circuit that generates a control signal, said resettable logic circuit activating said control signal whenever said keydown signal is activated and for deactivating said control signal when said debounce signal is deactivated and said counter circuit generated a predefined one of said column selection signals, said resettable logic circuit activating said control signal when a second switch from a second column is pressed before said closed switch from a first column different from said second column has been released;

said oscillator including a subcircuit that receives said control signal and disables said oscillator whenever said control signal is deactivated so as to deactivate said scanning circuit;

said scanning circuit including circuitry for simultaneously activating all of said columns via said driver circuit when said control signal is deactivated so that said encoder circuit will detect closure of any switch in said keypad and generate said keydown signal; and for activating only one of said columns at a time when said control signal is activated, said driver circuit having minimal energy consumption while activating all of said columns, said driver circuit thereby helping to minimize energy usage by said keypad encoder when said control signal is deactivated; said scanning circuit resuming scanning said columns of said keypad when said closed switch is released and said second switch in said second column was pressed before said closed switch from said first column different from said second column has been released;

wherein when any first key is pressed and then any second key in a different column from said first column is pressed before said first key is released, and then said first key is released prior to said second key is released; said scanning circuit stops scanning while generating the scanning signal corresponding to said first column, resumes scanning after said first key is released and then stops scanning a second time while generating the scanning signal corresponding to said second column, and said encoder circuit generates two successive key identification signals identifying said first key and then said second key.

12. A method of identifying pressed keys in a keypad having an array of keys coupled to switches arranged in columns and rows such that depressing any key on the keypad closes a corresponding switch that couples one of said columns to one of said rows; the steps of the method comprising:

activating a keydown signal whenever any switch in any of said keypad columns is closed and deactivating said keydown signal when none of said switches in any of said keypad columns is closed;

generating a control signal, said control signal having first and second states, including putting said control signal in said first state whenever said keydown signal is activated and setting said control signal in said second state after said keydown signal is deactivated;

asserting a scanning signal on said columns of said keypad in a predefined sequence only when said control signal is in said first state, said scanning signal coupled to each of said columns by a column driver so that said column drivers are active as long as said control signal is not in said first state, said column drivers when active maintaining said columns at a low voltage level so as to minimize energy usage by said column driver and to minimize energy usage by said keypad encoder when said control signal is not in said first state;

generating a key identification signal identifying which of said rows, if any, has a closed switch in any of said keypad columns on which said scanning circuit has asserted said scanning signal; and generating output signals, including said key identification signal, identifying said closed switch;

when any first key is pressed and then any second key in a different column from said first column is pressed before said first key is released, and then said first key is released prior to when said second key is released;

asserting said scanning signal on said columns in said predefined sequence a first time after said first key remains pressed and asserting said scanning signal on said columns in said predefined sequence a second time after said first key is released; and generating a first key identification signal identifying said first key while said first key remains pressed and generating a second key identification signal identifying said second key only after said first key is released.

13. The method of claim 12, including low pass filtering and integrating said keydown signal to generate a debounce signal that is delayed with respect to said keydown signal, including activating and deactivating said debounce signal after said keydown signal is activated and deactivated, respectively;

said scanning step including generating count signals in a sequence corresponding to said predefined sequence;

said control signal generating step including setting said control signal to said second state when said debounce signal is deactivated and said count signals having a predefined count value.

14. The method of identifying pressed keys of claim 12, including:

when said any first key is pressed and then said any second key in a different column from said first column is pressed before said first key is released, and then said first key is released prior to when said second key is released:

asserting said scanning signal on said columns in said predefined sequence a first time after said first key remains pressed and asserting said scanning signal on said columns in said predefined sequence a second time after said first key is released.

15. A keypad encoder for use with a keypad having an array of keys coupled to switches arranged in columns and rows such that depressing any key on the keypad closes a corresponding switch that couples one of said columns to one of said rows; said keypad encoder comprising:

an encoder circuit, coupled to said rows of said keypad, that activates a keydown signal whenever any switch in any of said keypad columns is closed and deactivates said keydown signal when none of said switches in any of said keypad columns is closed;

a resettable logic circuit that generates a control signal, said control signal having first and second states, said resettable circuit putting said control signal in said first state whenever said keydown signal is activated by said encoder circuit, and setting said control signal in said second state after said keydown signal is deactivated by said encoder circuit, said resettable logic circuit putting said control signal in said first state when a second switch from a second column is pressed before said closed switch from a first column different from said second column has been released;

a scanning circuit coupled to said columns of said keypad, that asserts a scanning signal on said columns of said keypad in a predefined sequence only when said control signal is in said first state, said scanning circuit coupled to each of said columns by a column driver so that said column drivers are active as long as said control signal is not in said first state, said column drivers when active maintaining said columns at a low voltage level so as to minimize energy usage by said column driver and to minimize energy usage by said keypad encoder when said control signal is not in said first state;

said encoder circuit including circuitry that generates a key identification signal identifying which of said rows, if any, has a closed switch in any of said keypad columns on which said scanning circuit has asserted said scanning signal; and an output circuit, coupled to said encoder circuit, that stores and outputs signals identifying said closed switch;

wherein said column driver is a two input NOR gate with an open-drain configuration, a first of said inputs being an inverted version of said control signal and a second of said inputs being an inverted version of said scanning signal.

16. A keypad encoder for use with a keypad having an array of keys coupled to switches arranged in columns and rows such that depressing any key on the keypad closes a corresponding switch that couples one of said columns to one of said rows; said keypad encoder comprising:

an encoder circuit, coupled to said rows of said keypad, that activates a keydown signal whenever any switch in any of said keypad columns is closed and deactivates said keydown signal when none of said switches in any of said keypad columns is closed;

a resettable logic circuit that generates a control signal, said control signal having first and second states, said resettable circuit putting said control signal in said first state whenever said keydown signal is activated by said encoder circuit, and setting said control signal in said second state after said keydown signal is deactivated by said encoder circuit, said resettable logic circuit putting said control signal in said first state when a second switch from a second column is pressed before said closed switch from a first column different from said second column has been released;

a scanning circuit, coupled to said columns of said keypad, that asserts a scanning signal on said columns of said keypad in a predefined sequence only when said control signal is in said first state, said scanning circuit coupled to each of said columns by a column driver so that said column drivers are active as long as said control signal is not in said first state, said column drivers when active maintaining said columns at a low voltage level so as to minimize energy usage by said column driver and to minimize energy usage by said keypad encoder when said control signal is not in said first state;

said encoder circuit including circuitry that generates a key identification signal identifying which of said rows, if any, has a closed switch in any of said keypad columns on which said scanning circuit has asserted said scanning signal;

an output circuit, coupled to said encoder circuit, that stores and outputs signals identifying said closed switch;

a debounce circuit that low pass filters and integrates said keydown signal to generate a debounce signal that is delayed with respect to said keydown signal; said debounce circuit activating and deactivating said debounce signal at circuitry determined delays after said keydown signal is activated and deactivated, respectively;

said scanning circuit including a counter that generates count signals in a sequence corresponding to said predefined sequence;

said resettable logic circuit including logic for setting said control signal to said second state when said debounce signal is deactivated and said counter generates count signals having a predefined count value; and an early DA off circuit buffer that activates a data available signal when said signals identifying said closed switch are ready to be read by an external device, said DA off circuit buffer deactivating said data available signal before said debounce signal is deactivated and after the later event of said keydown signal being deactivated, indicating said key has been released, and an output enable signal being asserted by an external device, indicating said signals identifying said closed switch have been read by said external device.

17. A keypad encoder for use with a keypad having an array of keys coupled to switches arranged in columns and rows such that depressing any key on the keypad closes a corresponding switch that couples one of said columns to one of said rows; said keypad encoder comprising:

a scanning circuit, coupled to said columns of said keypad by a plurality of column drivers, each said column driver corresponding to one of said columns, that asserts a scanning signal on said columns of said keypad in a predefined sequence when said scanning circuit is operated in a first mode and that asserts said scanning signal on all of said columns of said keypad simultaneously when said scanning circuit is operated in a second mode, said column drivers minimizing energy consumption of said keypad encoder when said scanning circuit is operated in said second mode;

an encoder circuit, coupled to said rows of said keypad, that generates a first signal identifying which of said rows, if any, has a closed switch in any of said keypad columns on which said scanning circuit has asserted said scanning signal, and that activates a keydown signal whenever any switch in any of said keypad columns on which said scanning circuit has asserted said scanning signal is closed and deactivates said keydown signal when none of said switches in any of said keypad columns on which said scanning circuit has asserted said scanning signal is closed;

an output circuit coupled to said encoder circuit, that stores and outputs signals identifying said closed switch;

a resettable logic circuit that generates a control signal, said control signal having first and second states, said control signal putting said scanning circuit in said first mode when said control signal is in said first state and putting said scanning circuit in said second mode when said control signal is in said second state; said resettable circuit putting said control signal in said first state whenever said keydown signal is activated by said encoder circuit, and setting said control signal in said second state after said keydown signal is deactivated by said encoder circuit, said resettable logic circuit thereby minimizing energy consumption of said keypad when said keypad is waiting for said keydown signal to be activated by said encoder circuit; said resettable logic circuit putting said control signal in said first state when a second switch from a second column is pressed before said closed switch from a first column different from said second column has been released;

a debounce circuit that low pass filters said keydown signal to generate a debounce signal that is delayed with respect to said keydown signal; said debounce circuit activating and deactivating said debounce signal at circuitry determined delays after said keydown signal is activated and deactivated, respectively;

said scanning circuit including a counter that generates count signals in a sequence corresponding to said predefined sequence;

said resettable logic circuit including logic for setting said control signal to said second state when said debounce signal is deactivated and said counter generates count signals having a predefined count value; and an early DA off circuit buffer that activates a data available signal when said signals identifying said closed switch are ready to be read by an external device, said DA off circuit buffer deactivating said data available signal before said debounce signal is deactivated and after the later event of said keydown signal being deactivated, indicating said key has been released, and an output enable signal being asserted by an external device, indicating said signals identifying said closed switch have been read by said external device.

18. A keypad encoder for use with a keypad having an array of keys coupled to switches arranged in columns and rows such that depressing any key on the keypad closes a corresponding switch that couples one of said columns to one of said rows; said keypad encoder comprising:

an encoder circuit, coupled to said rows of said keypad, that activates a keydown signal whenever any switch in any of said keypad columns is closed and deactivates said keydown signal when none of said switches in any of said keypad columns is closed;

a resettable logic circuit that generates a control signal, said control signal having first and second states, said resettable circuit putting said control signal in said first state whenever said keydown signal is activated by said encoder circuit, and setting said control signal in said second state after said keydown signal is deactivated by said encoder circuit, said resettable logic circuit putting said control signal in said first state when a second switch from a second column is pressed before said closed switch from a first column different from said second column has been released;

a scanning circuit, coupled to said columns of said keypad, that asserts a scanning signal on said columns of said keypad in a predefined sequence only when said control signal is in said first state, said scanning circuit coupled to each of said columns by a column driver so that said column drivers are active as long as said control signal is not in said first state, said column drivers when active maintaining said columns at a low voltage level so as to minimize energy usage by said column driver and to minimize energy usage by said keypad encoder when said control signal is not in said first state;

said encoder circuit including circuitry that generates a key identification signal identifying which of said rows, if any, has a closed switch in any of said keypad columns on which said scanning circuit has asserted said scanning signal; and an output circuit, coupled to said encoder circuit, that stores and outputs signals identifying said closed switch;

said keypad encoder including logic for generating two successive key identification signals at non-overlapping times when any first key is pressed and then any second key in a different column from said first column is pressed before said first key is released, and then said first key is released prior to when said second key is released, wherein said encoder circuit generates a first key identification signal identifying said first key while said first key remains pressed and generates a second key identification signal identifying said second key only after said first key is released.

* * * * *

UNITED STATES PATENT AND TRADEMARK OFFICE
CERTIFICATE OF CORRECTION

PATENT NO. : 5,539,400
DATED : July 23, 1996
INVENTOR(S) : JAMES A. MEARS

It is certified that error appears in the above-indentified patent and that said Letters Patent is hereby corrected as shown below:

In Col. 12, line 44, delete "While" and replace with --while--.

In Col. 14, line 52, after "circuit" insert --,--.

In Col. 16, line 35, after the first occurrence of "circuit" insert --,--.

Signed and Sealed this

Fifth Day of November, 1996

Attest:

BRUCE LEHMAN

Attesting Officer     Commissioner of Patents and Trademarks